United States Patent [19]

Miyawaki

[11] Patent Number: 5,543,648
[45] Date of Patent: Aug. 6, 1996

[54] SEMICONDUCTOR MEMBER AND SEMICONDUCTOR DEVICE HAVING A SUBSTRATE WITH A HYDROGENATED SURFACE

[75] Inventor: Mamoru Miyawaki, Isehara, Japan

[73] Assignee: Canon Kabushiki Kaisha, Tokyo, Japan

[21] Appl. No.: 574,784

[22] Filed: Dec. 19, 1995

Related U.S. Application Data

[63] Continuation of Ser. No. 354,443, Dec. 12, 1994, abandoned, which is a continuation of Ser. No. 9,086, Jan. 26, 1993, abandoned.

[30] Foreign Application Priority Data

Jan. 31, 1992 [JP] Japan .................................. 4-016745

[51] Int. Cl.$^6$ .......................... H01L 21/08; H01L 21/74; H01L 21/306
[52] U.S. Cl. ........................ 257/347; 257/353; 257/345; 257/354; 257/627; 257/628
[58] Field of Search ................................ 257/347, 353, 257/354, 345, 627, 628

[56] References Cited

U.S. PATENT DOCUMENTS

| | | | |
|---|---|---|---|
| 3,612,960 | 10/1971 | Takeishi et al. | 257/627 |
| 4,278,987 | 7/1981 | Imaizumi et al. | 257/627 |
| 5,096,854 | 3/1992 | Saito et al. | 437/225 |
| 5,230,768 | 7/1993 | Furukawa et al. | 257/627 |
| 5,432,379 | 7/1995 | Eguchi et al. | 257/627 |
| 5,483,084 | 1/1996 | Hirabayashi | 257/627 |

FOREIGN PATENT DOCUMENTS

| | | | |
|---|---|---|---|
| 0468213 | 1/1992 | European Pat. Off. | H01L 21/306 |
| 61-193456 | 11/1986 | Japan . | |

OTHER PUBLICATIONS

Boss et al. "Crystal Orientation for Integrated Device Fabrication" I.B.M. Technical Disclosure Bulletin, vol. 8, No. 12, May 1966, pp. 1710&1711.

Takechi et al. "Mobility Improvement Mechanism in a-Si:H TFTs with Smooth a-Si:H/SiH/sub x/interface" {IN Amorphous Silicon Technology-1992, Symposium, San Fransisco, CA, USA, Apr. 27–May 1, 1992} Amorphous Silicon Technology-1992, Symposium, Mater. Res. Soc., XXUT 1198.

Ohmi et al., Particle Free Wafer Cleaning and Drying Technology, Aug. 1989, IEEE Transactions on Semiconductor Manufacturing, vol. 2, No. 3, pp. 69–75.

Ohmi et al., Principles of Wet Chemical Processing in VLSI Microfabrication, Feb. 1991, IEEE Transactions on Semiconductor Manufacturing, vol. 4, No. 1, pp. 26–34.

Miyashita et al., 1991 Symposium on VLSI Technology, "Dependence of Thin Oxide Film Quality", IEEE Cat. No. 91 CH 3017-1 (Mar. 28, 1991) pp. 45–46.

Ohmi et al., IEEE Transactions on Electron Devices, "Dependence of Thin Oxide Films Quality on Surface Microroughness", vol. 39, No. 3 (Mar. 1992) pp. 537–545.

Primary Examiner—Rolf Hille
Assistant Examiner—Alexander O. Williams
Attorney, Agent, or Firm—Fitzpatrick, Cella, Harper & Scinto

[57] ABSTRACT

A semiconductor member with a monocrystalline semiconductor layer for forming a functional element. The main plane of the monocrystalline semiconductor layer has a center line average surface roughness Ra of not more than 0.4 nm when the main plane is washed with an aqueous ammonia-hydrogen peroxide solution in a ratio of $NH_4OH:H_2O_2:H_2O$ of 1:1:5 by volume at a washing temperature of 85° C. for a washing time of 10 minutes.

9 Claims, 4 Drawing Sheets

OTHER PUBLICATIONS

Heyns et al., Microelectronic Engineering, "Impact of Silicon Surface Characteristics on MOS device yield for VLSI", vol. 10, No. 3/4 (Feb. 1991), pp. 237–239, 248–250.

Delarios et al., Appl. Phy. Letters,"Effect of $SiO_2$ Surface Chemistry on the Oxidation of Silicon", vol. 54, No. 8 (Feb. 20, 1989), pp. 715–717.

Haisma et al., Japanese Journal of Applied Physics, "Silicon–on–Insulator Wafer Bonding–Wafer Thinning Technology Evaluations", vol. 28, No. 8 (Aug. 1989), pp. 1426–1443.

SEMICONDUCTOR MEMBER AND SEMICONDUCTOR DEVICE HAVING A SUBSTRATE WITH A HYDROGENATED SURFACE

This application is a continuation of application Ser. No. 08/354,443 filed Dec. 12, 1994, now abandoned, which in turn, is a continuation of application Ser. No. 08/009,086, filed Jan. 26, 1993, now abandoned.

BACKGROUND OF THE INVENTION

1. Field of the Invention

The present invention relates to a semiconductor member, particularly a semiconductor member suitable for forming an integrated circuit with a high degree of integration, and a semiconductor device comprising the semiconductor member and a functional element formed thereon.

2. Related Background Art

Semiconductor members, typical of which is a monocrystalline Si wafer, have been used as members for forming an integrated circuit and those with better crystal quality have been developed.

Alternatively, a higher degree of integration and a higher speed working have been keenly required for the integrated circuits, as information handed by system machines has been increased. With the advance in higher integration, dimensions of elements such as transistors in the integrated circuit have been made finer and finer, and the reliability of the individual elements has become very important for maintaining or increasing the chip yield over a given level in the process for preparing semiconductor devices. The reliability of the individual elements such as transistors, diodes, etc. largely depends on the surface flatness and crystallinity of a semiconductor member for forming an integrated circuit. For example, in order to attain a degree of integration of 256M bit to 1 G bit level in DRAM, it is necessary that an insulating layer formed on the surface of a semiconductor has a very small thickness such as 1.0 to 1.5 nm. Furthermore, semiconductor members having a crystallinity good enough to form DRAM having a refresh cycle of 64 msec to 128 msec have been desired.

In order to enhance the reliability of transistors, it is essential, besides the aforementioned requirements, to remove metallic or organic contamination and particles present on the surfaces of semiconductor members. To this end, several surface washing processes have been proposed, and a washing process for removing metallic or organic contamination and particles by washing with an aqueous ammonia-hydrogen peroxide solution ($NH_4OH:H_2O_2:H_2O$) has been regarded as promising up to now.

However, in case of the conventional semiconductor members of bulk Si, etc., the contamination can be removed by washing with an aqueous ammonia-hydrogen peroxide solution of the ordinary composition, i.e. composition in a ratio of $NH_4OH:H_2O_2:H_2O=1:1:5$ by volume, but such a flat surface before the washing as a surface flatness of 0.2 nm is roughed to about 0.5 nm or more after the washing, and when a MOS-FET is formed thereon, the dielectric strength of gate oxide film fails to satisfy the design requirement.

On the other hand, silicon-on-insulator (SOI) type wafers having the following distinguished characteristics have attracted attention as different semiconductor members from the bulk Si semiconductor members:

1. Easy dielectric isolation with a possibility of higher level integration,
2. Distinguished resistance to radiation,
3. Reduced floating capacity with a possibility of higher speed,
4. Omission of well formation step,
5. Prevention of latch-up,
6. Possibility to form a fully depleted field effect transistor by thin film formation,
7. Possibility to suppress a short channel effect even in microtransistors.

Most widely employed SOI type semiconductor members include two types, i.e. a wafer called SIMOX and an SOI wafer which is formed by bonding two Si wafers to each other (bonded SOI wafer).

SIMOX (separation by ion-implanted oxygen) wafer is formed by implanting oxygen into an Si monocrystalline semiconductor substrate through ion implanting to form an $SiO_2$ layer inside the Si monocrystalline semiconductor substrate, and by providing an Si monocrystalline semiconductor thin layer on its surface. The SIMOX wafer having such a structure has been now widely employed among the SOI type semiconductor members, because of relatively good matching with the Si semiconductor process. However, in order to form the $SiO_2$ layer inside the Si monocrystalline semiconductor substrate, oxygen ions must be implanted at least at $10^{18}$ ions/cm$^2$, and the implantation time is very long and the commercial productivity is not so high. The wafer cost is also high. Furthermore, the Si monocrystalline semiconductor thin layer has many crystal defects generated in the ion implanting step. Thus, the SIMOX wafer cannot have essentially a crystallinity good enough to prepare a high level integrated circuit in good yield. Furthermore, the SIMOX wafer will have a surface flatness of more than several nm, when the surface is washed with the aqueous ammonia-hydrogen peroxide solution, and thus is not suitable for forming a high level integrated circuit thereon.

On the other hand, the bonded SOI wafer is formed from a pair of Si wafers by oxidizing the surface of a first Si wafer to form an $SiO_2$ layer, bonding a second wafer to the surface of the $SiO_2$ layer of the first wafer, and then polishing the free surface of the second wafer to form an Si monocrystalline thin layer on the $SiO_2$ layer. The bonded SOI wafer has a better crystallinity than that of the SIMOX wafer, but the polishing must be carried out under a strict control of the thickness of the Si monocrystalline thin layer. However, it is now very difficult to control the layer thickness control to obtain a layer thickness distribution of less than a few % over the entire wafer surface. Furthermore, the surface of the bonded SOI wafer will be roughed to a surface flatness of 0.5 to 0.8 nm when washed with the aqueous ammonia-hydrogen peroxide solution, and the distinguished characteristics properly possessed by the SOI type wafer cannot be utilized.

As explained above, the surface flatness and the crystallinity of so far available semiconductor members are not always satisfactory for forming semiconductor devices with a high degree of integration and a high speed working on a mass-production scale.

SUMMARY OF THE INVENTION

An object of the present invention is to solve the problems of the prior art and provide a semiconductor member capable of forming an integrated circuit with a high speed working and a high degree of integration on a mass-production scale and also to provide a semiconductor device using the semiconductor member.

Another object of the present invention is to provide a semiconductor member, which comprises a monocrystalline semiconductor layer for forming a functional element, wherein main plane of the monocrystalline semiconductor layer having a center line average roughness Ra of not more than 0.4 nm as a surface state characteristics when the main plane is washed with an aqueous ammonia-hydrogen peroxide solution in a ratio of $NH_4OH:H_2O_2:H_2O$ of 1:1:5 by volume at a washing temperature of 85° C. for a washing time of 10 minutes.

DETAILED DESCRIPTION OF THE PREFERRED EMBODIMENTS

Figure 1:
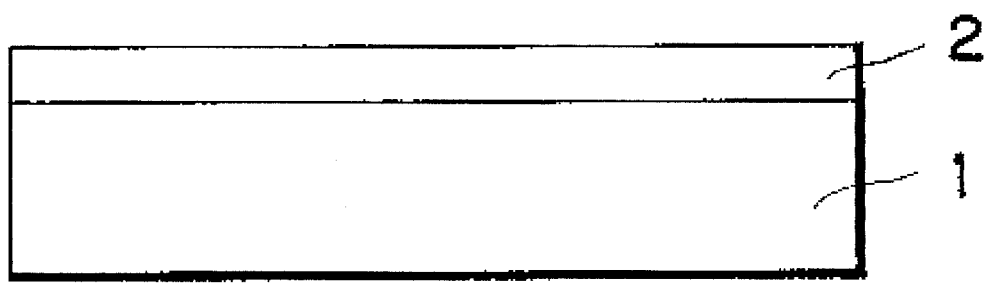
FIG. 1 is a schematic cross-sectional view showing a first example of the present invention.

The preferred embodiments of the semiconductor member of the present invention are described below.

According to the present invention, there is provided a semiconductor member, which comprises a monocrystalline semiconductor layer for forming a functional element, wherein main plane of the monocrystalline semiconductor layer having a center line average roughness Ra of not more than 0.4 nm as a surface state characteristics when the main plane is washed with an aqueous ammonia-hydrogen peroxide solution in a ratio of $NH_4OH:H_2O_2:H_2O$ of 1:1:5 by volume at a washing temperature of 85° C. for a washing time of 10 minutes, where the monocrystalline semiconductor layer may be an epitaxial growth layer formed on a semiconductor substrate or thereon through an insulating layer.

Furthermore, in the present semiconductor device, a functional element is formed on the semiconductor member.

In the present semiconductor member, the main plane of the monocrystalline layer for forming an integrated circuit is very flat and the monocrystalline layer has a very good crystallinity. Thus, a semiconductor device with a remarkably high speed working and a considerably high degree of integration, as compared with the conventional one, can be formed with the semiconductor member, and can be commercially produced in high yield on a remarkable mass-productuin scale.

The preferred embodiments of the present invention will be described in detail, referring to the drawings.

FIG. 1 is a schematic cross-sectional view showing a semiconductor member according to a preferable embodiment of the present invention.

In FIG. 1, numeral 1 is a monocrystalline substrate, which is usually a so called 4°-off substrate whose surface is inclined from the (100) plane at 4°±0.5°, and whose conduction type is p-type or n-type. An n+ or p+ ion-implanted layer, which will serve as an embedded layer in the later step of forming a functional element, may be provided on the surface of substrate 1.

Numeral 2 is an Si epitaxial layer made to grow on the monocrystalline substrate 1, and its layer thickness is preferably 0.01 μm to several tens μm. Concentration of an impurity contained in the layer can be selected in view of the form of a device to be formed on the Si epitaxial layer. At least the main surface of the monocrystalline substrate 1, on which to provide an Si epitaxial layer 2, is polished by a polishing technique with high precision, and it is desirable that the center line average roughness Ra defined in JIS code XB0601 is not more than 0.2 nm.

When the semiconductor member shown in FIG. 1 is washed with an aqueous ammonia-hydrogen peroxide solution (evaluation washing solution) in a ratio of $NH_4OH:H_2O_2:H_2O=1:1:5$ by volume at a washing temperature of 85° C. for 10 minutes, and washed with ultrapure water adjusted to room temperature (dissolved oxygen concentration: 40 ppb or less) for 10 minutes, the center line average surface Ra of the surface is not more than 0.2 nm. It is desirable for strict washing evaluation that the evaluation washing solution for use in the present invention is in a relatively high grade among the now available aqueous ammonia-hydrogen peroxide solutions for use in the formation of integrated circuit devices with high degree of integration. Above all, a solution prepared with "29 wt. % EL+" produced by Sankyo Kasei K. K. as $NH_4OH$, "30 wt. % High Grade" produced by Santoku Kagaku K. K. as $H_2O_2$, and ultrapure water (dissolved oxygen concentration: 40 ppb or less) as $H_2O$ is more preferably used in the present invention.

Example 1

A semiconductor member having the same structure as shown in FIG. 1 was prepared according to the following steps:

A 4°-off, n-type substrate (S) having an impurity concentration of $10^{15}$ $cm^{-3}$, polished to a surface flatness of not more than 0.2 nm was washed with a liquid mixture of hydrosulfuric acid ($H_2SO_4$) and hydrogen peroxide solution ($H_2O_2$) in a ratio of $H_2SO_4:H_2O_2=4:1$ by volume, which will be hereinafter referred to as "$H_2SO_4/H_2O_2$ liquid mixture", for 5 minutes, and then rinsed with the same ultrapure water as mentioned above for 5 minutes. Then, the oxide film and metallic impurity formed on the surface were removed by an aqueous hydrofluoric acid-hydrogen peroxide solution in a ratio of $HF:H_2O_2:H_2O=0.05:0.1:9$ by weight. Then, the substrate (S) was washed with an aqueous ammonia-hydrogen peroxide solution in a ratio of $NH_4OH:H_2O_2:H_2O=1:1:5$ by volume to remove the particles. Then it was washed with the same ultrapure water as that described above and rinsed with hot ultrapure water (adjusted to the temperature of 100° C.) in an $N_2$ atmosphere, dried in an $N_2$ atmosphere by a spin drier and loaded into a low pressure CVD apparatus. Then, the low pressure CVD apparatus was brought in a low pressure state at not more than $10^{-6}$ Torr, and then a high purity hydrogen gas (residual water concentration: not more than 10 ppb) was introduced into the apparatus through a radical-forming catalyst. The surface of the substrate (S) was exposed to the hydrogen radical atmosphere for 30 minutes while heating the substrate (S) at 300° C., thereby subjecting the surface of the substrate (S) to a hydrogenation treatment. The heating temperature of the substrate (S) can be appropriately selected in view of other conditions, and it is desirable to set the heating temperature to any temperature between 200° and 400° C. The degree of hydrogenation-treated state on the surface of substrate (S) was evaluated by determining the thickness of the spontaneously oxidized film formed on the surface by an XPS (X-ray Photoelectron Spectroscopy) apparatus after being left in the atmosphere for one week. The degree of the hydrogeneration-treated state on the surface of substrate (S) hydrogeneration-treated in the foregoing procedure was such that the thickness of the spontaneously oxidized film on the surface was not more than 0.2 nm, that is, no substantial growth of the spontaneously oxidized film was observed, and thus the surface of substrate (S) was presumed to be terminated substantially with hydrogen. Then, Si was made to epitaxially grow on the hydrogenation-treated surface of substrate (S) with a reactant gas $SiH_2Cl_2$ at a flow rate of 1,000 SCCM, a pressure of 80 Torr and a temperature of 950° C.

As explained above, the surface unevenness of the Si substrate (S) before the epitaxial growth was controlled to Ra of not more than 0.2 nm, and the surface of the Si substrate (S) before the epitaxial growth was terminated with hydrogen. No contaminants were attached to the surface of the Si substrate (S) and thus the Si monocrystal could be made to grow on the surface of the Si substrate (S) with good crystallinity.

Then, the thus prepared semiconductor member was washed with an aqueous ammonia-hydrogen peroxide solution in a ratio of $NH_4OH:H_2O_2:H_2O=1:1:5$ by volume at 85° C. for 10 minutes and then washed with the same ultrapure water as above at room temperature for 10 minutes and then with the same hot pure water as above for 10 minutes. Observation of the surface of epitaxial layer after the washing by a scanning tunnel microscope (STM) revealed that the surface unevenness was at Ra of not more than 0.2 nm.

In this example, the crystallinity of the Si epitaxial layer was evaluated according to the following procedure besides the evaluation of surface flatness of the Si epitaxial layer:

The surface of the Si epitaxial layer after the above-mentioned washing with the aqueous ammonia-hydrogen peroxide solution, the pure water at room temperature and the hot pure water was etched away by repetitions of wet oxidation (by oxygen bubbled in water) at 1,000° C. for 4 hours and washing with the aqueous ammonia-hydrogen peroxide solution to investigate relationship between the etching progress and the surface unevenness. It was found that the surface unevenness was increased up to a depth of about 40 nm with etching, but thereafter reached a substantially constant value. The etching-treated surface of the Si epitaxial layer was very flat such as a surface roughness Ra of not more than 0.3 nm, when the Si epitaxial layer was etched away down to a depth of 40 nm from the main plane of the present semiconductor member. This shows that the epitaxial layer had a very good crystallinity.

A SRAM device having a degree of integration of 16M composed of fine MOS-FETs having a gate length of 0.3 µm was formed on the semiconductor member having the thus formed epitaxial layer in the structure as shown in FIG. 1. It was formed in high yield, such as 70%. The access time of the thus obtained SRAM device was 5 to 6 nsec, and thus could perform a high speed working. Its technical reason seems to be due to the facts that the interface between the gate insulating layer and the Si epitaxial layer was very flat and the interface mobility was as high as that of bulk Si.

Example 2

Figure 2:
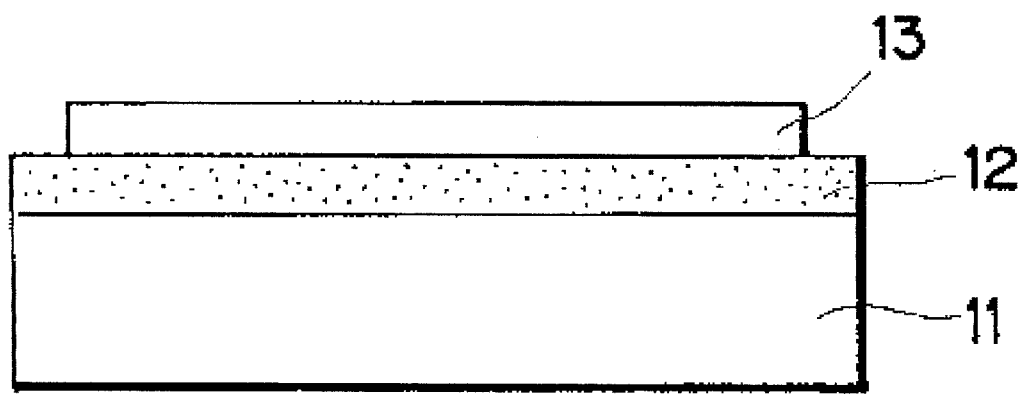
FIG. 2 is a schematic cross-sectional view showing a second example of the present invention.

FIG. 2 is a schematic cross-sectional view showing the second example of the semiconductor member of the present invention.

In FIG. 2, numeral 11 is a substrate whose surfaces were polished to a center line average roughness Ra of about 0.2 nm, and an Si substrate, etc. can be used. Conductive type of the Si substrate 11 can be either n-type or p-type, and its impurity concentration depends on a device to be formed on a monocrystalline Si thin film, which will be explained later, and usually is $10^{15}$ to $10^{16}$ cm$^{-3}$. Numeral 12 is an $SiO_2$ layer having a thickness of usually 0.1 to 1.0 µm. In case of forming a high dielectric strength MOS-FET, the thickness can be as large as a few to several tens µm. Numeral 13 is a monocrystalline Si thin film having a thickness of usually 0.01 to a few tens µm. As shown in FIG. 2, the monocrystalline Si thin film 13 is in such a structure that its edges are located at inner positions than the edges of both substrate 11 and $SiO_2$ layer 12. The monocrystalline Si thin film 13 has a flat surface having a center line average roughness Ra of not more than 0.4 nm when washed with the above-mentioned aqueous ammonia-hydrogen peroxide solution.

In case of forming a functional element on the semiconductor member as shown in FIG. 2, it is necessary to form an oxide layer such as a gate oxide layer.

The oxide layer was formed according to the following procedure.

Initially, the semiconductor member was washed with a liquid mixture of $H_2SO_4/H_2O_2$ for 5 minutes, then with the same ultrapure water as above for 5 minutes, and with the same aqueous hydrofluoric acid-hydrogen peroxide solution as above to remove the oxide film formed on the surface and the metallic impurity contaminated therein. Then, the surface of the semiconductor member was washed with an ammonia-hydrogen peroxide solution in a ratio of $NH_4OH:H_2O_2:H_2O=1:1:5$ by volume to remove the particles, whereby the particles were substantially completely removed from the surface. Then, the semiconductor member was washed with the same ultrapure water at room temperature and the same hot ultrapure water as above. The surface of the monocrystalline Si thin film had a center line average roughness Ra of not more than 0.4 nm at that time. Then, an integrated circuit device of 200,000 gates of MOS-FETs was prepared with the monocrystalline Si thin film. The gate oxide films of MOS-FETs were formed to a thickness of 100 Å by dry oxidation at 1,000° C. The dielectric strength of the thus formed oxide film was such a high value as 12 MV/cm or higher at all the MOS-FETs.

The semiconductor member shown in FIG. 2 was prepared according to the steps shown in FIGS. 3A to 3F (A first preparation process).

Figure 3A:
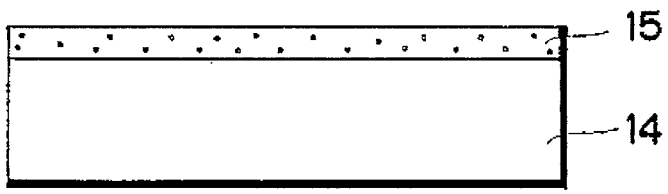
FIGS. 3A to 3F are cross-sectional views showing a process for preparation according to the second example.

A first p-type substrate 14 having an impurity concentration of $10^{17}$ to $10^{19}$ cm$^{-3}$ and a platinum electrode were dipped in a solution of $HF:H_2O:C_2H_5OH=1:1:1$ by volume and a positive voltage was applied to the former, while a negative voltage was applied to the latter, thereby passing a current therebetween at a current density of 30 mA/cm². A porous Si layer 15 was formed on the surface of the substrate 14 thereby, as shown in FIG. 3A. The porous Si layer 15 had very fine pores such as a few nm in diameter, and a pore distance of several tens nm. Then, the solution was replaced with a solution of $H_2O:C_2H_5OH=1:1$ by volume, and the polarity was reversed. By passing a current therebetween, the hydrofluoric acid taken into the porous layer was withdrawn. Then, the substrate was washed with a liquid mixture of $H_2SO_4:H_2O_2=4:1$ by volume for 5 minutes and then rinsed with pure water for 10 minutes. Then, the substrate was heated to 400° C. in an $N_2$ atmosphere and baked in vacuum and purged with an inert gas such as $N_2$, etc. Furthermore, the substrate was subjected to heat treatment in an $O_2$ atmosphere at 400° C. for 30 minutes to fill the pore insides of the porous layer with an oxide layer and also to form an oxide layer on the surface. After the heat treatment in the $O_2$ atmosphere, the thin oxide film formed on the surface was removed with a solution of $HF:H_2O_2:H_2O=$ 0.05:0.1:9 by weight, and then the substrate was subjected to heat treatment in a hydrogen atmosphere at 900° C. for 10 minutes, whereby the surface unevenness of the porous layer 15 was flattened. In place of the heat treatment in the hydrogen atmosphere, it is possible to heat the substrate (S) to 200° to 400° C. and irradiate it with hydrogen ECR plasma (10 mTorr, 200 W), or to subject it to surface treatment with an $H_2$-diluted, ultraviolet-excited $F_2$ gas. In the latter case, a remarkable flattening effect can be obtained with a gas mixture containing 0.03% by volume of $O_2$, and 0.5% by volume of $F_2$, diluted with 50% by volume of $H_2$.

Figure 3B:
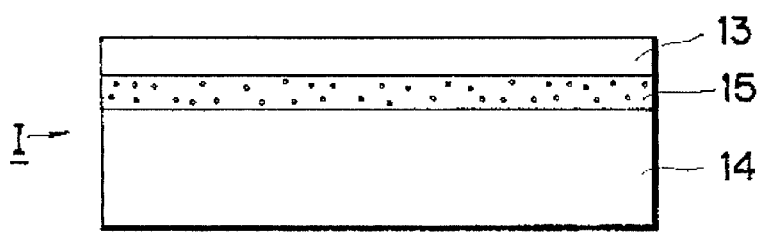

An Si monocrystalline layer 13 having a thickness of 0.1 to 1 μm was made to epitaxially grow on the flattened porous layer 15 by molecular beam epitaxial growth, bias sputtering, low pressure CVD, etc. at a low temperature (desirably by maintaining the epitaxial growth surface at a temperature of 300° to 900° C.) at a lower growth rate (FIG. 3B). In this example, bias sputtering was employed, and the Si epitaxial layer 13 was made to grow on the flattened porous layer 15 in an Ar plasma atmosphere of 3 mTorr under a base pressure of $10^{-10}$ Torr, while maintaining the epitaxial growth surface at 350° C., to obtain a semiconductor member I.

The surface unevenness of the thus grown Si epitaxial layer 13 had a center line average roughness Ra of about 0.3 nm, as evaluated by STM measurement.

It seems that the much flattened surface of the thus grown Si epitaxial layer 13 is due to the epitaxial growth on the flattened porous layer 15.

The surface of the semiconductor member I, shown in FIG. 3B was washed with the same ammonia-hydrogen peroxide solution, then with the same ultrapure water at room temperature, and then with the same hot ultrapure water as above in an $N_2$ atmosphere (washing time: 500 to 600 seconds), whereby the surface of the Si epitaxial layer 13 was terminated with hydrogen and chemically stabilized and had an improved resistance to contamination of other impurities.

Figure 3C:
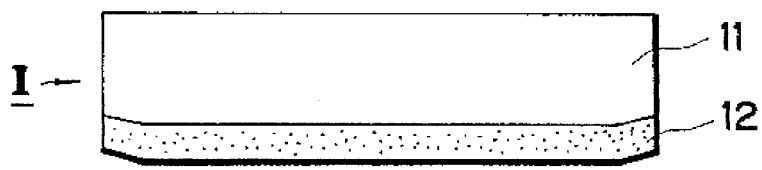

Then, a thermally oxidized layer 12 having a thickness of 500 nm was formed on the surface of a second Si substrate 11, as shown in FIG. 3C, to obtain a semiconductor member II. The thus obtained semiconductor member II was placed into an $N_2$ atmosphere in a bonding apparatus together with the semiconductor member I shown in FIG. 3B.

Figure 3D:
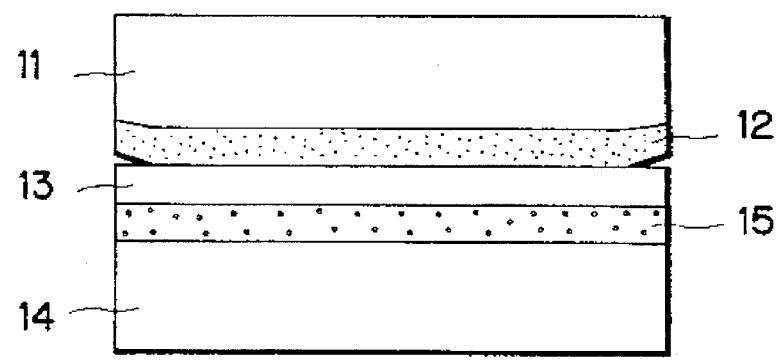

The surface of the thermally oxidized layer 12 was brought into contact with the surface of the epitaxial layer 13 in that state, as shown in FIG. 3D, and heated to about 800° to about 900° C., whereby these two surfaces were stably bonded each other. By heat treatment at such a low temperature, the p-type impurity contained in the porous layer 15, such as boron, could be prevented from diffusion into the epitaxial layer 13.

Figure 3E:
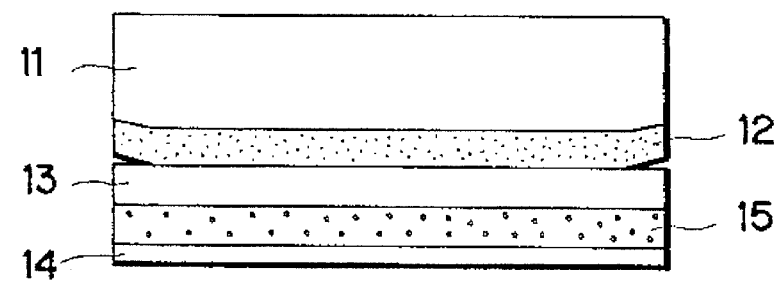

Then, the Si substrate 14 was removed by a back grinder, while leaving the Si substrate having a thickness of only a few to several tens μm to remain, as shown in FIG. 3E. Then, the remaining Si layer 14 was etched with a solution of hydrofluoric acid-nitric acid, where the side surfaces of the epitaxial Si layer 13 were etched away, but the porous layer 15 was not etched by the solution of hydrofluoric acid-nitric acid.

Selective etching procedure for electroless wet etching of only the porous Si layer 15 will be explained below.

Preferable etching solutions capable of selectively etching only porous Si without etching crystalline Si include hydrofluoric acid; buffered hydrofluoric acid containing ammonium fluoride ($NH_4F$), hydrogen fluoride (HF), etc.; liquid mixture of hydrofluoric acid or buffered hydrofluoric acid, admixed with hydrogen peroxide solution; liquid mixture of hydrofluoric acid or buffered hydrofluoric acid, admixed an alcohol; and liquid mixture of hydrofluoric acid or buffered hydrofluoric acid, admixed with hydrogen peroxide solution and an alcohol. The bonded substrates were impregnated with the etching solution and etched. Etching rate depended on concentrations of hydrofluoric acid or buffered hydrofluoric acid and hydrogen peroxide solution and temperature. By the addition of hydrogen peroxide solution, oxidation of Si could be accelerated and the reaction rate could be increased, as compared with the case without such an addition. Furthermore, changing the mixing ratio of hydrogen peroxide the reaction rate could be controlled. By the addition of alcohol, bubbles of reaction product gas by the etching could be instantaneously removed from the etched surface without stirring and porous Si could be uniformly and efficiently etched away.

An HF concentration in the buffered hydrofluoric acid is preferably 1 to 95% by weight, more preferably 1 to 85% by weight, most preferably 1 to 70% by weight on the basis of the etching solution. An $NH_4F$ concentration in the buffered hydrofluoric acid is preferably 1 to 95% by weight, more preferably 5 to 90% by weight, most preferably 5 to 80% by weight on the basis of the etching solution.

An HF concentration is preferably 1 to 95% by weight, more preferably 5 to 90% by weight, most preferably 5 to 80% by weight on the basis of the etching solution.

An $H_2O_2$ solution is preferably 1 to 95% by weight, more preferably 5 to 90% by weight, most preferably 10 to 80% by weight on the basis of the etching solution, and is set to a range capable of attaining the effect of hydrogen peroxide.

An alcohol concentration is preferably not more than 80% by weight, more preferably not more than 60% by weight, most preferably not more than 40% by weight on the basis of the etching solution, and is set to a range capable of attaining the effect of alcohol.

The temperature is set to a range of preferably 0° to 100° C., more preferably 5° to 80° C., most preferably 5° to 60° C.

Alcohol for use in the present invention includes ethyl alcohol and other alcohols practically applicable to processes with the desirable effect of alcohol addition, such as isopropyl alcohol, etc.

Figure 3F:
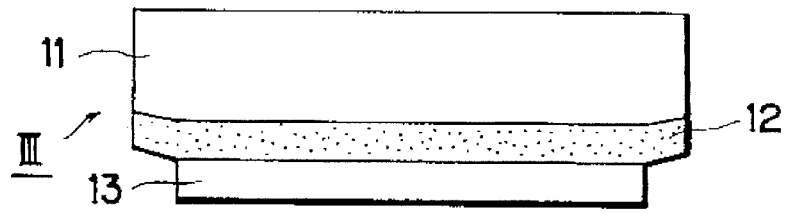

In the thus obtained semiconductor member III in the structure shown in FIG. 3F, a monocrystalline Si layer equivalent to the ordinary Si wafer is formed all over the substrate 11 in a large area as a flat and uniform thin layer.

The semiconductor member III in the form after the above-mentioned etching step of the porous layer 15, as shown in FIG. 3F, has substantially the same structure as shown in FIG. 2. As shown in FIG. 3E, the periphery of the semiconductor member has a slightly smaller thickness, and thus the epitaxial layer 13 and the $SiO_2$ layer 12 are not bonded to each other at the periphery of the semiconductor member. Thus, the epitaxial layer 13 is formed in little inner positions from the edges of the semiconductor member, as shown in FIG. 3F.

When the Si epitaxial layer 13 was washed with the aqueous ammonia-hydrogen peroxide solution, its surface was very flat, for example, with a center line average roughness Ra of not more than 0.3 nm according to the investigation by a scanning tunnel microscope (STM). By repetitions of wet oxidation and washing with the aqueous ammonia-hydrogen peroxide solution, the Ra, after removal by etching down to 40 nm, was not more than 0.3 nm, and it was found that the epitaxial layer had a good crystallinity. Furthermore, when bulk Si was washed with the washing solution and conditions of the present invention, the surface unevenness of bulk Si became larger as compared with that of the washed epitaxial Si layer. It seems that this difference is due to difference of oxygen concentration incorporated into the crystal, etc.

As explained above, the Si epitaxial layer 13 on the $SiO_2$ layer 12 could enhance the device characteristics, because the crystal defect and impurity contamination could be suppressed to a lower level than those of the ordinary wafer.

A second process for preparing the semiconductor member shown in FIG. 2 will be explained below, referring to FIGS. 4A to 4C.

Figure 4A:
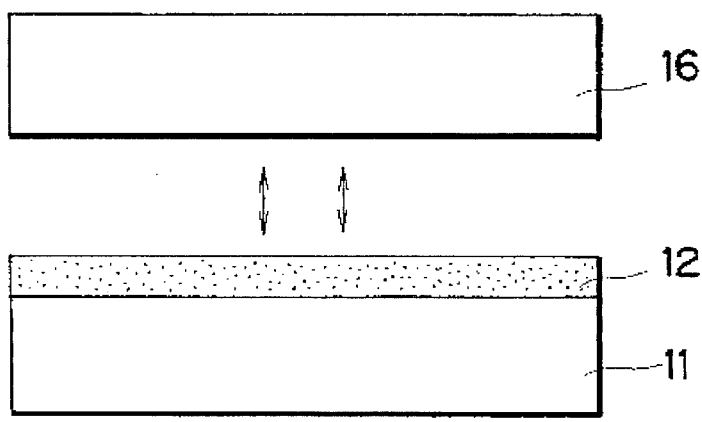
FIGS. 4A to 4C are cross-sectional views showing another process for preparation according to the second example.
Figure 4B:
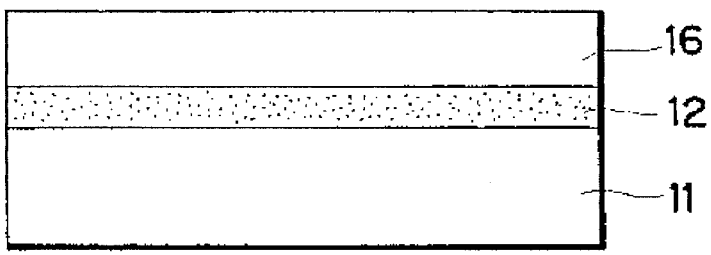
Figure 4C:
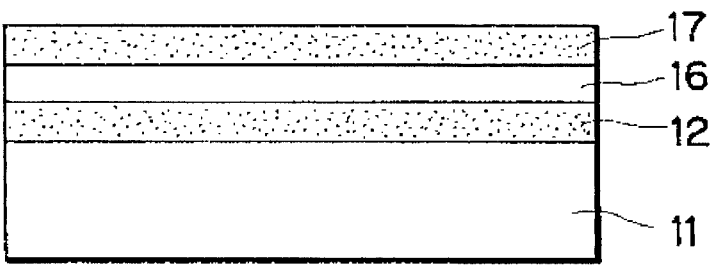

As shown in FIG. 4A, a thermally oxidized film 12 was formed on a first substrate, for example, p-type Si (100) substrate 11. A second substrate with polished surfaces having a roughness Ra=about 0.2 nm, for example, a second Si (100) substrate 16 having an impurity concentration of $10^{14}$ cm$^{-3}$, was bonded to the oxide film 12 of the first substrate 11. Washing before the bonding was carried out in the same manner as explained in the first process. Then, the second substrate 16 was removed by polishing, etc. while leaving it with a desired Si thin film thickness+thickness of about 0.8 to about 1.2 μm to remain, as shown in FIG. 4B. The desired Si thin film thickness was about 0.05 to about 0.2 μm in case of forming a fully depleted SOI type MOS-FET. Removal of the Si layer 16 can be carried out not only by polishing, but also by dry etching, etc. Then, as shown in FIG. 4C, an oxide layer 17 was formed on the surface of the Si layer 16 by wet oxidation at 1,000° C. to make the Si layer 16 to take a desired thickness. Through this step, the defects present in the Si substrate 16 were taken into the oxide layer 17 and turned to a good crystalline layer. The oxide layer 17 could be removed by a solution of $BHF:NH_4F+H_2O+HF$ containing a surfactant. The structure after the removal of oxide layer 17 was the same as shown in FIG. 2. When the semiconductor member in the structure as shown in FIG. 2, prepared according to the second process was washed with the aqueous ammonia-hydrogen peroxide solution for 10 minutes, the surface unevenness Ra was not more than 0.4 nm. When the semiconductor member in the structure as shown in FIG. 2, prepared according to the second process was subjected to repetitions of wet oxidation (1,000° C., 4 hours) and washing with the aqueous ammonia-hydrogen peroxide solution (10 minutes) to remove the Si monocrystalline thin film down to a depth of 40 nm from the free surface by etching, the etched surface of the remaining Si monocrystalline thin film had an Ra of not than 0.5 nm.

Example 3

Figure 5:
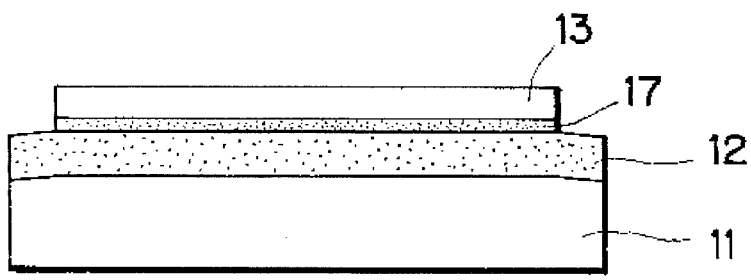
FIG. 5 is a schematic cross-sectional view showing a third example of the present invention.

FIG. 5 schematically shows a cross-section of a third example of the present invention.

A difference of this example from that shown in FIG. 2 is bonding of the monocrystalline Si thin film 13 to the insulating layer 12 formed on the other Si substrate 11 through an $SiO_2$ layer 17. With this structure the interface between the Si layer 13 as an active layer for the device and the $SiO_2$ layer 12 is not a bonded interface, and thus the interface level can be reduced, as compared with the second example. In case of forming a transistor, etc. on the semiconductor member, an advantage of reducing leak current can be obtained.

A procedure for preparing such a structure will be briefly explained below. The wafer processed up to the step as shown in FIG. 3B was dipped in a mixture of platinum-hydrogen peroxide solution, Pt-H$_2$O$_2$, whereby a thin oxide film having a thickness of ten and odd Å on the wafer surface was formed. Then, the wafer was heated in an N$_2$ atmosphere at 500° C. to increase the density of the thin oxide film. By this treatment, an oxide film 17 having a very uniform thickness and a good quality could be formed at such a low temperature as 500° C. Since the oxidation temperature was low, there was no boron diffusion from the porous layer, giving no influence to the device. Furthermore, the oxide film was as thin as 10 and odd Å, and there were no bonding problems such as warping due to oxidation, etc.

The surface roughness after the washing with the aqueous ammonia-hydrogen peroxide solution and the surface roughness after the removal down to a depth of 40 nm by etching were the same as in Examples 1 and 2.

Example 4

Figure 6:
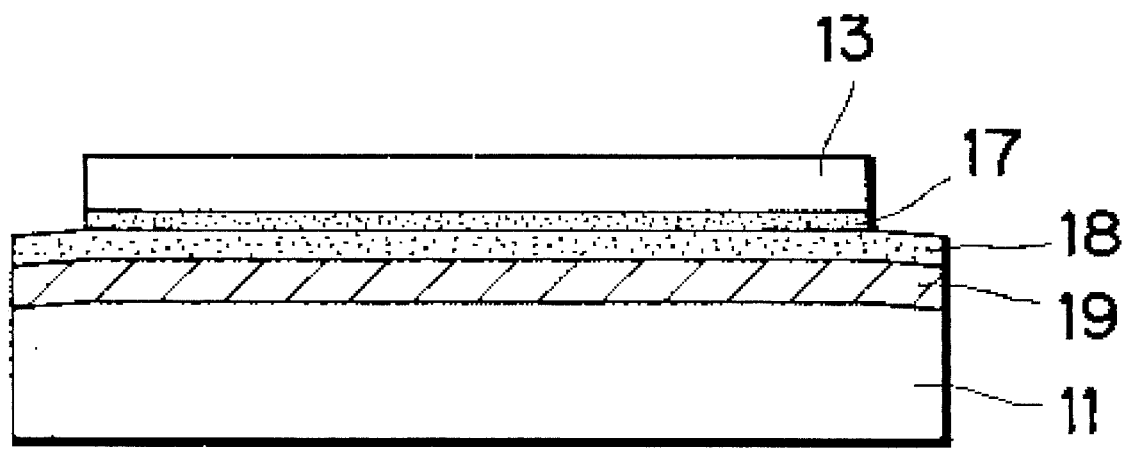
FIG. 6 is a schematic cross-sectional view showing a fourth example of the present invention.

FIG. 6 is a schematic cross-sectional view of a fourth example of the present invention.

A difference from the examples shown in FIGS. 1 and 2 is that the insulating layer provided on the surface of substrate 11 is not always a thermally oxidized film. In FIG. 6, numeral 18 is BPSG (boron-phosphorus doped glass), and 19 is an $SiO_xN_{1-x}$ film. By providing a layer composed of a material having distinguished reflow characteristics at the bonding interface, as compared with $SiO_2$, the bonding became more complete and the uniformity was improved.

In this example, a combination of BPSG with the SiON film has been explained, but NSG (non-doped glass) or PSG having better reflow characteristics than those of BPSG or thermally oxidized $SiO_2$ film, which is formed by CVD can be provided alone, and besides SiON, it is possible to use AlN, SiN, etc. or their combinations.

Example 5

Semiconductor members were prepared by carrying out all the steps of the foregoing individual examples in an inert gas atmosphere such as Ar, N$_2$, etc., of low carbon content, while irradiating the inert gas with an ultraviolet beam, thereby ionizing the atmosphere and removing the static electricity generated by the gas flow on the wafer. Usually, the wafer is readily charged to a few tens kV by downflow of N$_2$ gas. Bonding of wafers becomes uneven, and the wafers are charged, whereby particles are attached to the wafers, resulting in generation of microvoids.

However, these problems could be solved by the above-mentioned prevention of wafers from the charging and yield could be increased in the preparation of wafers. It is possible to carry out some important steps, for example, a bonding step, in an ionized inert gas without carrying out all the steps in an inert gas atmosphere.

Example 6

A sixth example of the present invention will be explained below.

In the second example, the surface of Si epitaxial layer was terminated with hydrogen by washing with hot pure water, whereas in this example the Si surface was exposed to a hydrogen radical atmosphere to remove a spontaneous oxide film or metallic impurities formed on the surface, and the Si surface in the activated state was bonded to an $SiO_2$ layer on the surface of another wafer. To conduct the hydrogen radical treatment, a catalyst was provided in the hydrogen gas inlet, and a hydrogen gas was passed through the catalyst. In the case of conducting the Si epitaxial growth by a bias sputtering apparatus, it was possible to conduct the Si growth in the sputter chamber and successively bonding the wafer to another wafer therein or further introducing an $O_2$ gas into the sputter chamber to slightly oxidize the surface and then conducting such bonding in the sputter chamber.

As explained above, the bonding temperature could be made lower than before by bonding the Si layer to the $SiO_2$ layer in a hydrogen radical atmosphere and problems of boron doping from the porous layer and thermal strains could be solved thereby.

Example 7

An $SiO_2$ layer having a thickness of 8,500 Å was formed on an n-type substrate having an impurity concentration of $10^{15}$ cm$^{-3}$, and a monocrystalline Si thin film having a thickness of 0.5 μm was further formed thereon. SRAM of CMOS structure was formed on the monocrystalline Si thin film under the following conditions. The gate length of CMOS was 0.3 μm and the degree of integration was 16M bits.

At first, LOCOS for device isolation was formed. LOCOS had a film thickness of 10,000 Å, so that the device isolation could be completely attained by an insulating layer. Then, ion implantation for forming a p-well was conducted at a dose of $1 \times 10^{12}$ cm$^{-2}$ and an acceleration voltage of 80 keV and ion implantation for forming an n-well at a dose of $5 \times 10^{11}$ cm$^{-2}$ and an acceleration voltage of 100 keV, and heating was carried out at 150° C. for 2 hours to make activation. Then, the Si monocrystalline surface was washed with $H_2SO_4 + H_2O_2$, then with water, and then with an aqueous ammonia-hydrogen peroxide solution ($NH_4OH:H_2O_2:H_2O = 0.1:1:5$ by volume), and again washed with water at room temperature and hot pure water. Then, an oxide film having a thickness of 150 Å was formed thereon by dry oxidation at 1,000° C. in a gate oxidation furnace. Then poly Si was formed as a gate by CVD, and source drain ion implantation for nMOS was carried out at a dose of $7 \times 10^{15}$ cm$^{-2}$ and an acceleration voltage of 100 keV and source drain ion implantation for pMOS at a dose of $2 \times 10^{15}$ cm$^{-2}$ and 35 keV, and annealing was carried out at 1,000° C. for 5 minutes. Then, BPSG was formed as an interlayer insulating layer, and contact holes were patterned. Al-Si-Cu for wiring was formed as a film by sputtering. After the sputtering, SiN was formed as a passivation film to prepare chips.

In the case of preparing 1,000 chips, there were no chips of poor mode due to dielectric strength failure of gate oxide film at all, and a good gate dielectric strength was obtained. By realization of low parasitic capacity structure of SOI device and high mobility of transistor, such a high speed working as an access time of 3 to 4 ns could be confirmed.

When a similar SRAM was formed on a wafer shown in FIG. 1, there was also no failure due to the dielectric strength failure of gate oxide film, and a good gate dielectric strength was obtained.

CCD of 2,000,000 image elements per inch was prepared with the wafer of the present invention. Fixed pattern noise of CCD is usually due to the dark current generated in the image element region as a principal cause, but generation of dark current when heated to 45° C. was suppressed to such a very low level as not more than 0.01 nA/cm$^2$, and not only unevenness of the wafer surface, but also crystal defect inside the Si layer was confirmed to be lower than the conventional one.

As described above, a semiconductor member of the present invention has a monocrystalline layer with a very flat main plane for forming an integrated circuit, and with a very high crystallinity, and a semiconductor device with a high speed and a high degree of integration can be formed with the present semiconductor member.

What is claimed is:

1. A semiconductor member comprising: a substrate having a hydrogenated surface and a monocrystalline semiconductor layer for forming a functional element on said substrate, wherein the main plane of the monocrystalline semiconductor layer has a center line average surface roughness Ra of not more than 0.4 nm as a surface state characteristic when the main plane is washed with an aqueous ammonia-hydrogen peroxide solution in a ratio of $NH_4OH:H_2O_2:H_2O$ of 1:1:5 by volume at a washing temperature of 85° C. for a washing time of 10 minutes.

2. A semiconductor member comprising: a substrate having a hydrogenated surface and a monocrystalline semiconductor layer for forming a functional element on said substrate, wherein the main plane of the monocrystalline semiconductor layer has a center line average surface roughness Ra of not more than 0.4 nm as a surface state characteristic when the main plane is washed with an aqueous ammonia-hydrogen peroxide solution in a ratio of $NH_4OH:H_2O_2:H_2O$ of 1:1:5 by volume at a washing temperature of 85° C. for a washing time of 10 minutes, and wherein the etching-treated surface of the monocrystalline semiconductor layer has a center line average surface roughness Ra of not more than 0.4 nm as an etched surface state characteristic, when repeatedly subjected to wet oxidation at 1,000° C. for 4 hours and the washing at the washing temperature of 85° C. for the washing time of 10 minutes, thereby etching away the monocrystalline semiconductor layer to a depth of 40 nm from the main plane.

3. A semiconductor member according to claim 1 or 2, wherein the monocrystalline semiconductor layer is an epitaxial growth layer formed on said substrate.

4. A semiconductor member according to claim 1 or 2, wherein the monocrystalline semiconductor layer is formed on said substrate through an insulating layer.

5. A semiconductor device comprising: a substrate having a hydrogenated surface and a monocrystalline semiconductor layer for forming a functional element on said substrate, the main plane of which has a center line average surface roughness Ra of not more than 0.4 nm as a surface state characteristic when the main plane is washed with an aqueous ammonia-hydrogen peroxide solution in a ratio of $NH_4OH:H_2O_2:H_2O$ of 1:1:5 by volume at a washing temperature of 85° C. for a washing time of 10 minutes and a functional element provided on the monocrystalline semiconductor layer.

6. A semiconductor device comprising: a substrate having a hydrogenated surface and a monocrystalline semiconductor layer, the main plane of which has a center line average roughness Ra of not more 0.4 nm as a surface state characteristic when the main plane is washed with an aqueous ammonia-hydrogen peroxide solution in a ratio of $NH_4OH:H_2O_2:H_2O$ of 1:1:5 by volume at a washing temperature of 85° C. for a washing time of 10 minutes and the etching-treated surface of which has a center line average surface roughness Ra of not more than 0.4 nm as an etched surface state characteristic, when repeatedly subjected to wet oxidation at 1,000° C. for 4 hours and the washing at the washing temperature of 85° C. for the washing time of 10 minutes, thereby etching away the monocrystalline semiconductor layer to a depth of 40 nm from the main plane, and a functional element provided on the monocrystalline semiconductor layer.

7. A semiconductor device according to claim 5 or 6, wherein the monocrystalline semiconductor layer is an epitaxial growth layer formed on said substrate.

8. A semiconductor device according to claim 5 or 6, wherein the monocrystalline semiconductor layer is formed on said substrate through an insulating layer.

9. A semiconductor member according to claim 3, wherein said epitaxial growth layer is formed on a 4° off substrate.

* * * * *